US008231979B2

(12) United States Patent
Noh et al.

(10) Patent No.: US 8,231,979 B2
(45) Date of Patent: Jul. 31, 2012

(54) MULTIFERROIC LAYER, STRUCTURE INCLUDING THE LAYER, AND METHODS OF FORMING THE LAYER AND THE STRUCTURE

(75) Inventors: Tae Won Noh, Seoul (KR); Jong Gul Yoon, Gyeonggi-do (KR); Jung Hyuk Lee, Gyeonggi-do (KR)

(73) Assignee: Seoul National University R & DB Foundation, Seoul (KR)

(*) Notice: Subject to any disclaimer, the term of this patent is extended or adjusted under 35 U.S.C. 154(b) by 511 days.

(21) Appl. No.: 12/282,345

(22) PCT Filed: Feb. 16, 2007

(86) PCT No.: PCT/KR2007/000833
§ 371 (c)(1),
(2), (4) Date: Jan. 15, 2009

(87) PCT Pub. No.: WO2007/114561
PCT Pub. Date: Oct. 11, 2007

(65) Prior Publication Data
US 2009/0246543 A1 Oct. 1, 2009

(30) Foreign Application Priority Data
Apr. 3, 2006 (KR) .................. 10-2006-0030176

(51) Int. Cl.
*B32B 15/04* (2006.01)
*H01F 1/00* (2006.01)
(52) U.S. Cl. ............... 428/469; 428/693.1; 428/701; 252/62.51 R
(58) Field of Classification Search .............. None
See application file for complete search history.

(56) References Cited

U.S. PATENT DOCUMENTS

| 6,764,770 | B2 * | 7/2004 | Paranthaman et al. | ........ 428/469 |
| 7,258,927 | B2 * | 8/2007 | Foltyn et al. | .................. 428/469 |
| 2004/0121191 | A1 | 6/2004 | Paranthaman et al. | |
| 2005/0019594 | A1 * | 1/2005 | Hunt et al. | .................. 428/469 |
| 2005/0245039 | A1 | 11/2005 | Li et al. | |
| 2006/0141291 | A1 * | 6/2006 | Foltyn et al. | .................. 428/701 |
| 2007/0012975 | A1 * | 1/2007 | Arendt et al. | ................. 257/295 |
| 2007/0191218 | A1 * | 8/2007 | Isogai et al. | ................. 502/302 |
| 2008/0234134 | A1 * | 9/2008 | Stan et al. | .................... 505/150 |

FOREIGN PATENT DOCUMENTS

| JP | 11354471 | 2/1999 |
| KR | 10-2006-0030176 | 2/2007 |

OTHER PUBLICATIONS

Balasubramanian et al. Ceramic Transactions, 162, 2005 abstract.*
Aono et al. J. of the Americal Ceramic Society, 2001 vol. 84 No. 5 p. 1-10.*
Choi et al. Integrated Ferroelectrics, 75 No. 12005, abstract.*

(Continued)

*Primary Examiner* — Jennifer McNeil
*Assistant Examiner* — Vera Katz
(74) *Attorney, Agent, or Firm* — SNR Denton US LLP (57) ABSTRACT

The present invention relates to forming the material represented by the following formula (1) into a layer having hexagonal crystalline structure, which is different from the orthorhombic crystalline structure of the material in bulk phase, so that the material can be used more effectively in various fields requiring multiferroic properties by obtaining multiferroic properties enhanced than the conventional multiferroic materials. $RMnO_3$, (R=Lanthanide) ... (1)

7 Claims, 8 Drawing Sheets

OTHER PUBLICATIONS

Lee et al. Condensed Matters, 2006, 1-14.*

Graboy, I.E., et al., HREM Study of Epitaxially Stabilized Hexagonal Rare Earth Manganites, Chemistry of Materials—Chem. Matter., 2003, vol. 15 No. 13, pp. 2632-2637, American Chemical Society.

Bosak, A.A., et al., Hexagonal rare earth (R=Eu-Dy) manganites: XRD study of epitaxially stabilized films, Crystal Engineering, 2002, vol. 5, pp. 355-364, Elsevier Science Ltd.

* cited by examiner

MULTIFERROIC LAYER, STRUCTURE INCLUDING THE LAYER, AND METHODS OF FORMING THE LAYER AND THE STRUCTURE

CROSS-REFERENCE TO OTHER APPLICATIONS

This is a National Phase of International Application No. PCT/KR2007/000833, filed on Feb. 16, 2007, which claims priority from Korean Patent Application No. 10-2006-0030176, filed on Apr. 3, 2006.

TECHNICAL FIELD

The present invention relates to a multiferroic layer, a structure including the layer, and methods for forming the layer and the structure. More particularly, it relates to a multiferroic layer with enhanced multiferroic properties, a structure including the layer, and methods for forming the layer and the structure.

BACKGROUND ART

Recently, there are lots of increasing interests on multiferroic materials. Multiferroic materials can be defined as materials which have at least two properties among (anti)ferroelectric, (anti)ferromagnetic and ferroelastic properties at the same time. For example, a multiferroic material having ferroelectric and ferromagnetic properties at the same time may change its magnetic property with an external electric signal, or change its electric property with an external magnetic signal by coupling the electric property of the ferroelectrics and magnetic property of the ferromagnetics.

Unlike prior art which prepared elements by coupling at least two materials having different properties, such characteristics of multiferroics enable new inventions such as a single material device equipped with various functions. Accordingly, recently, there are a great number of reports related to multiferroic materials. However, only few materials are known to have multiferroic properties.

Figure 1:
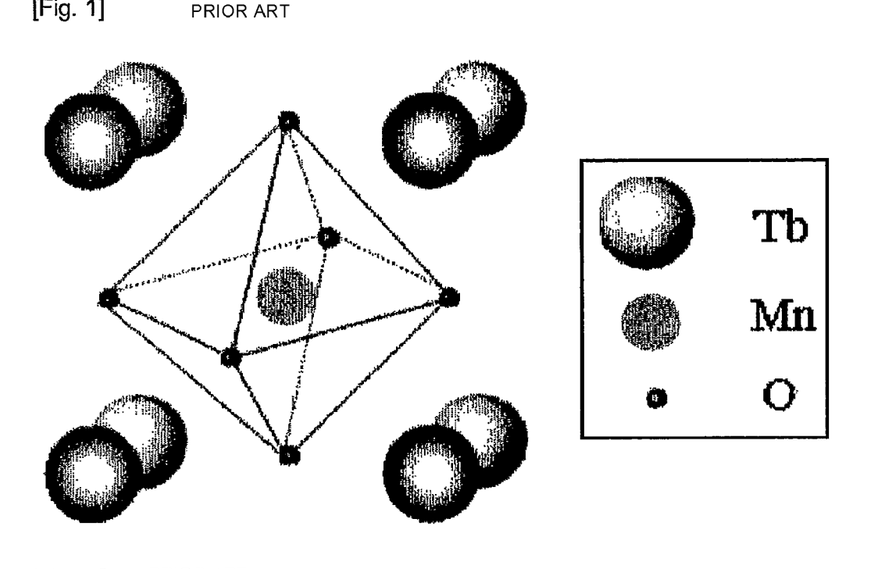
FIG. 1 is a diagram of the crystalline structure of TbMnO$_3$ in bulk phase.

Among them, currently, as a material having an orthorhombic crystalline structure, the orthorhombic manganites represented by the following formula $RMnO_3$ (R=La, Pr, Nd, Sm, Eu, Gd, Tb or Dy) are investigated actively. Said manganites have orthorhombic structure in bulk phase. In particular, among the manganites in bulk phase, the crystalline structure of $TbMnO_3$ is described in detail in FIG. 1. In bulk phase, the $TbMnO_3$ has orthorhombic properties as described in FIG. 1. The $TbMnO_3$ is a multiferroic material having ferroelectric and antiferromagnetic properties at the same time, and there is a strong coupling between said ferroelectric and antiferromagnetic properties. For example, the $TbMnO_3$ shows a flopping of polarization direction when magnetic field is applied. The material shows a ferroelectric property at a temperature in the range of about 21~27 K, and an antiferromagnetic property at a temperature in the range of 41~43 K.

Figure 2:
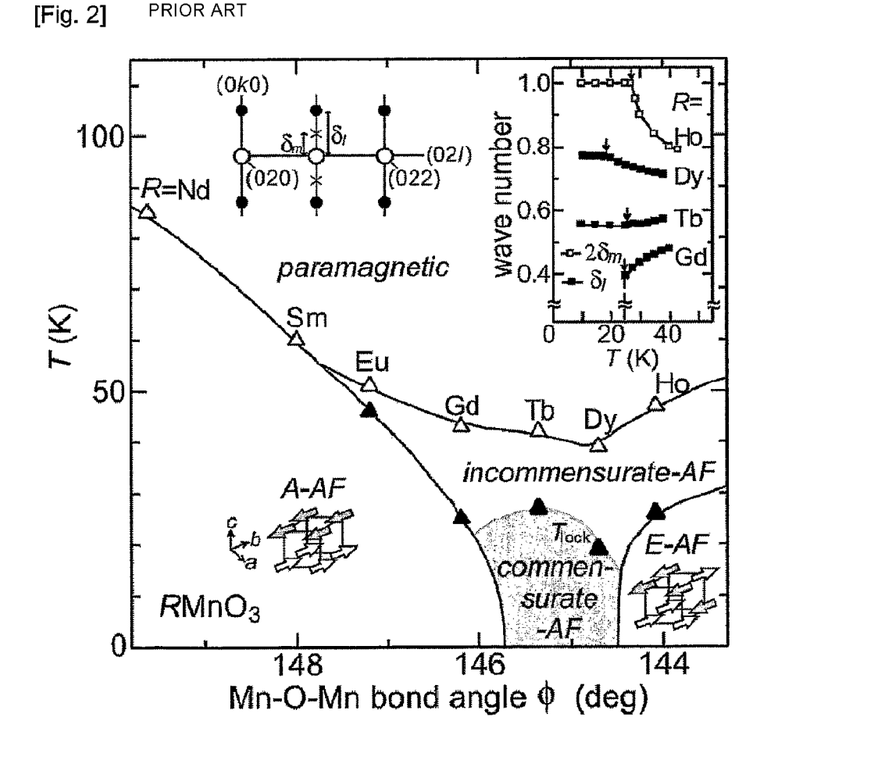
FIG. 2 is a phase diagram explaining the magnetic properties of orthorhombic manganites.

FIG. 2 is a phase diagram explaining the magnetic properties of orthorhombic manganites. As shown in FIG. 2, among the manganites represented by the above formula, the manganites present multiferroic properties only when R is Gd, Tb, and Dy, and it does not present multiferroic properties when R is Nd, Sm, and Eu. However, even when R is Gd, Tb, and Dy, there is a problem that the ferroelectric transition temperature Tc and remnant polarization value $P_R$ are too low to be applied to actual elements (For example, it can not be applied in a process using liquid nitrogen).

However, it is possible to change the physical properties of the specific material by changing the crystal structure of the material. This is because the band structure, orbital, phonon, etc. greatly change as the crystalline structure changes even when the chemical stoichiometry is the same. Bosak et al. reported in Cryst. Eng. 5, 355 (2002) and Chem. Mater. 15, 2632 (2003) the growth of $RMnO_3$ (R=Sm, Eu, Gd, and Dy) layer using YSZ (111) substrate. In particular, they showed that the $RMnO_3$ (R=Sm, Eu, Gd or Dy) layer could be grown to have hexagonal structure. However, they have not showed electric or magnetic properties of epitaxially stabilized hexagonal $RMnO_3$ layer. Thus, it has not been revealed whether the epitaxially stabilized hexagonal $RMnO_3$ layer has multiferroic properties or not. Also, they did not disclose a structure comprising a bottom or top electrodes which are essential for capacitor structure as well as a stabilized hexagonal $RMnO_3$ layer.

Therefore, the present inventors completed the present invention considering that multiferroic properties can be provided to the material, or that the multiferroic properties can be enhanced by substituting the crystalline structure of the orthorhombic $RMnO_3$ material for a hexagonal crystalline structure that is not present in the natural world.

SUMMARY OF THE INVENTION

Therefore, it is an object of the present invention to provide multiferroic layer with enhanced multiferroic properties.

It is another object of the present invention to provide a method to form said multiferroic layer.

It is still another object of the present invention to provide a structure including said multiferroic layer.

It is still another object of the present invention to provide a method to form said structure.

DETAILED DESCRIPTION

In order to achieve the objects of the present invention described above, the multiferroic layer has a hexagonal crystalline structure different from the orthorhombic crystalline structure in bulk phase, and comprises a material represented by the following formula (1).

$$RMnO_3 \quad (1)$$

In the above formula (1), R represents a lanthanide, and examples of said lanthanides are La, Pr, Nd, Sm, Eu, Gd, Tb, Dy, etc. In an embodiment of the present invention, said R is Gd, Tb or Dy. In this case, the crystalline structure in bulk phase can be orthorhombic, and can be epitaxially stabilized into hexagonal crystalline structure. Said multiferroic layer can have a ferroelectric transition temperature of at least 40 K, a remnant polarization value ($P_R$) of at least 1.0 μC/cm², and antiferroelectric properties at a temperature in the range of 60 K~200 K.

The method of forming the multiferroic layer for achieving another object of the present invention comprises the step of forming a multiferroic layer having a hexagonal crystalline structure different from an orthorhombic crystalline structure in bulk phase and comprising the material represented by the following formula (1), by using a substrate having a hexagonal surface structure different from an orthorhombic surface structure, the surface structure of the material in bulk phase.

$$RMnO_3 \quad (1)$$

In the method of forming the multiferroic layer in accordance with the present invention, the material represented by formula (1) can have an orthorhombic crystalline structure or a hexagonal crystalline structure as described above.

In the above method, when R is La, Pr, Nd, Sm or Eu, the materials which have an orthorhombic crystalline structure in bulk phase do not have multiferroic properties, and the materials which have hexagonal crystalline structure can have multiferroic properties. When R is Gd, Tb or Dy, the materials which have hexagonal crystalline structure and the materials which have orthorhombic crystalline structure can both have multiferroic properties. Here, said substrate can be a sapphire or YSZ (yttria-stabilized zirconia) substrate.

The structure for achieving another object of the present invention comprises a conductive layer having a hexagonal surface structure different from an orthorhombic surface structure to make a capacitor structure consisting of a multiferroic layer comprising the material represented by the following formula (1), a bottom and a top electrodes.

$$RMnO_3 \quad (1)$$

In the structure in accordance with the present invention, the materials represented by formula (1) can have a hexagonal crystalline structure as described above. In this case, the hexagonal surface structure can be the same as the surface structure of the hexagonal crystalline structure.

Said conductive layer may comprise a conductive material, and said conductive material can be exemplified by Ru, Os, Ir, Pt, Ti, TiN, Au, $IrO_2$, $SrRuO_3$, etc. According to an embodiment of the present invention, said conductive material comprises Pt.

Hereinafter, with reference to the attached drawings, the present invention will be described in more detail.

Multiferroic Layer

The multiferroic layer in accordance with the present invention comprises a material represented by the following formula (1) and has a hexagonal crystalline structure different from an orthorhombic structure in bulk phase.

$$RMnO_3 \quad (1)$$

In said formula (1), R represents a lanthanide such as lanthanum (La), praseodymium (Pr), neodymium (Nd), samarium (Sm), europium (Eu), gadolinium (Gd), terbium (Tb), dysprosium (Dy), etc. For example, R can be Gd, Tb or Dy.

Throughout the present specification, "the crystalline structure in bulk phase means the unique crystalline structure of a material when the material forms a mass (lump) in natural condition, i.e., a condition where no artificial distortion is exerted. It can have all the possible crystalline structures such as cubic, tetragonal, orthorhombic, monoclinic, triclinic, rhombohedral, and hexagonal.

Figure 3:
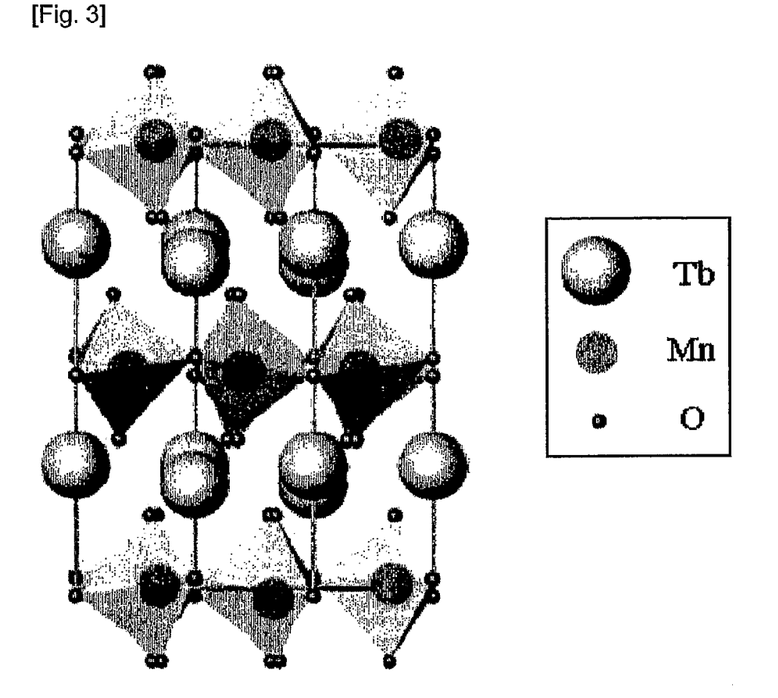
FIGS. 3 and 4 are diagrams of the hexagonal crystalline structure of TbMnO$_3$ layer.
Figure 4:
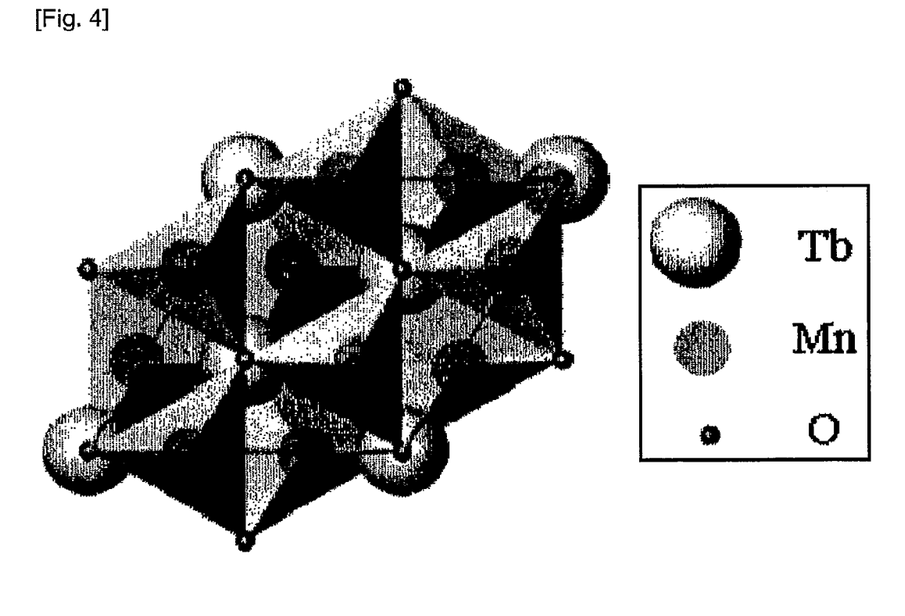

In accordance with an embodiment of the present invention, the crystalline structure in bulk phase is orthorhombic and the epitaxially stabilized structure is hexagonal. For example, if the material of the present invention is a $TbMnO_3$ layer, the material has a hexagonal crystalline structure which is different from the orthorhombic crystalline structure in bulk phase. The crystalline structure of $TbMnO_3$ having a hexagonal crystalline structure is shown in FIGS. 3 & 4.

In accordance with the present invention, the multiferroic layer comprising a material having a hexagonal crystalline structure different from an orthorhombic crystalline structure in bulk phase has relatively high ferroelectric transition temperature and larger remnant polarization value than the layer comprising a material having crystalline structure in bulk phase. For example, the multiferroic layer of the present invention can have ferroelectric transition temperature of at least 40 K, and in accordance with an embodiment of the present invention, said multiferroic layer has ferroelectric transition temperature of at least 60 K. Also, the multiferroic layer has remnant polarization value ($P_R$) of, for example, at least 1.0 $\mu C/cm^2$. Because the multiferroic layer of the present invention has ferroelectric transition temperature and remnant polarization value of the above range, it can have enhanced application possibilities.

Also, the multiferroic layer of the present invention has antiferroelectric properties throughout a wide temperature range. For example, the multiferroic layer can have antiferroelectric properties at a temperature the range of 60 K~200 K. Accordingly, said multiferroic layer can be used for various kinds of devices like temperature sensor or charge storage.

Hereinafter, the method of forming such a multiferroic layer will be described in detail.

Method of Forming a Multiferroic Layer

The method of forming a multiferroic layer of the present invention comprises the step of forming a layer comprising a material represented by the following formula (1) which has a hexagonal crystalline structure different from an orthorhombic crystalline structure in bulk phase on a substrate having a hexagonal surface structure different from an orthorhombic surface structure, the surface structure of the material in bulk phase.

$$RMnO_3 \quad (1)$$

The material represented by said formula (1) has already been described in detail. Thus, detailed description in this regard will be omitted.

When the material represented by said formula (1) has an orthorhombic crystalline structure, said material does not necessarily have multiferroic properties. That is, regardless of whether the material shows multiferroic properties in crystalline structure in bulk phase, i.e., orthorhombic crystalline structure, if the material shows multiferroic properties in a hexagonal crystalline structure different from the orthorhombic crystalline structure, the material falls within the scope of the present invention. For example, in formula (1), when R is Gd, Tb or Dy, the material has multiferroic properties even in a crystalline structure in bulk phase, while when R is La, Pr, Nd, Sm or Eu, the material does not exhibit multiferroic properties. However, when the material has a hexagonal crystalline structure, the material has multiferroic properties regardless of whether the material has multiferroic properties in bulk phase. In particular, in formula (1), when R is Gd, Tb or Dy, the material has enhanced multiferroic properties compared to that of an orthorhombic crystalline structure. Also, when R is La, Pr, Nd, Sm or Eu, the multiferroic properties that would not appear in the crystalline structure in bulk phase, would finally appear.

According to the method of the present invention, any substrate can be used if the surface structure (e.g. hexagonal surface structure) is different from the surface structure (e.g. orthorhombic surface structure) in bulk phase of the material. Examples of usable substrates are YSZ (yttria-stabilized zirconium) or sapphire substrate, etc. In such case, the orthorhombic surface structure in bulk phase means the surface structure when the material has an orthorhombic crystalline structure in bulk phase. Also, the hexagonal surface structure means the surface structure of a substrate that can form a hexagonal crystalline structure. In general, the surface structure of the hexagonal crystalline structure is the same as the hexagonal surface structure. That is, the crystalline structure of materials has close relation with the surface structure of the substrate on which the material is deposited. In accordance with an embodiment of the present invention, the preferable surface structure to form the layer having hexagonal crystalline structure is hexagonal. Meanwhile, the crystalline structure of the material depends on the surface structure of the substrate being used, not the crystalline structure of the substrate. Therefore, it is not required that the crystalline structure of the substrate should be the same as the hexagonal crystalline structure of said material.

The multiferroic layer formed according to the method of the present invention can have ferroelectric transition temperature of at least 40 K, for example at least 60 K. Also, said multiferroic layer can have remnant polarization ($P_R$) of at least 1.0 μC/cm$^2$, and can exhibit antiferroelectric properties throughout a temperature in the range of 60 K~200 K.

Structure Including Multiferroic Layer

The structure according to the present invention comprises a conductive layer having hexagonal surface structures different from the orthorhombic surface structure, which is the surface structure of a material in bulk phase, and a multiferroic layer having a hexagonal crystalline structure different from the orthorhombic crystalline structure in bulk phase and comprising said material represented by the following formula (1).

RMnO$_3$                             (1)

Since said multiferroic layer is described in the above, detailed explanation in this regard will be omitted.

Said conductive layer may comprise various conductive materials according to its use. Said conductive materials can be exemplified by Ru, Os, Ir, Pt, Ti, TiN, Au, IrO$_2$, SrRuO$_3$, etc., but are not limited to them. In accordance with an embodiment of the present invention, when said conductive layer is used as bottom electrode of the capacitor, said conductive layer may comprise Pt. In the structure of the present invention, said conductive layer is formed so that its surface structure (e.g. hexagonal surface structure) differs from the surface structure in bulk phase of the material (e.g. orthorhombic surface structure). In accordance with an embodiment of the present invention, when trying to form a layer having a hexagonal crystalline structure, the preferable surface structure of said conductive layer is hexagonal structure.

Figure 5:
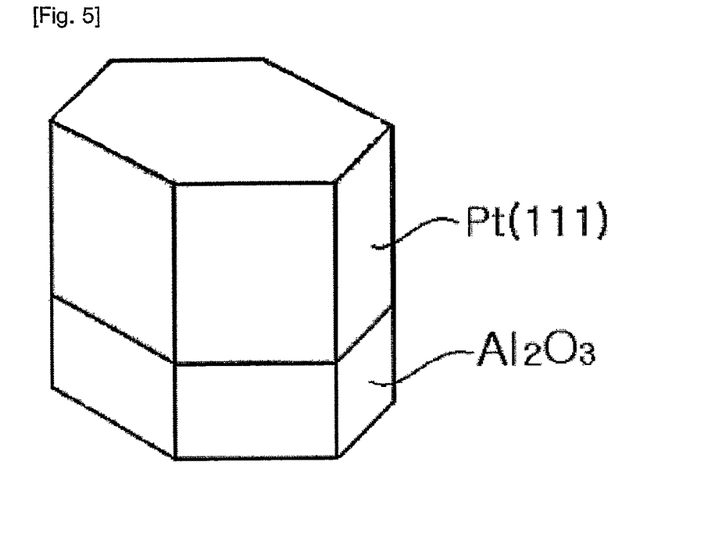
FIG. 5 is a diagram of the conductive Pt layer coated on sapphire substrate.
Figure 6:
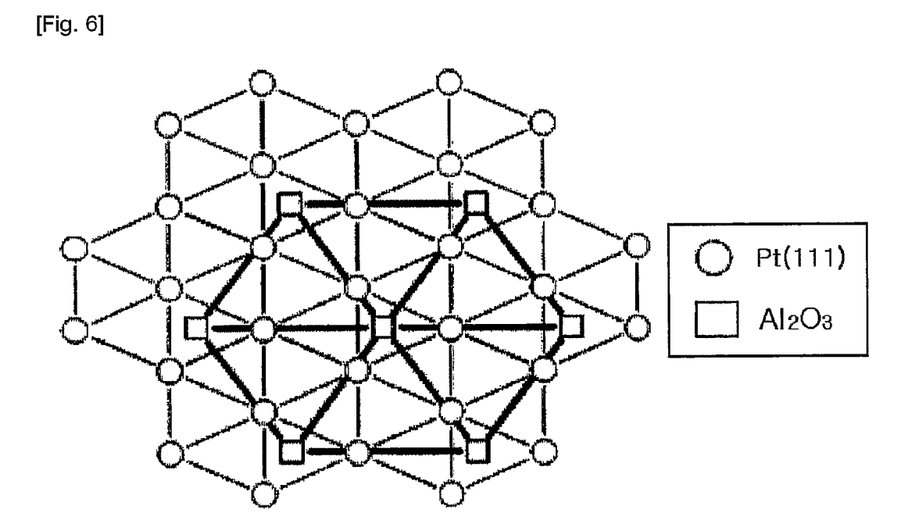
FIG. 6 is a schematic diagram of the surface structure of conducting Pt layer coated on sapphire substrate.

There is no restriction on the method to form the conductive layer. However, in accordance with an embodiment of the present invention, the conductive layer can be formed by epitaxial growth on the substrate. For example, when Pt is epitaxially grown on a sapphire substrate, said conductive layer has a hexagonal surface structure. FIG. 5 is a diagram illustrating the conductive layer comprising Pt formed on a sapphire substrate, and FIG. 6 is a schematic diagram of the surface structure of said conductive layer. As shown in FIGS. 5 & 6, the conductive layer formed by epitaxially growing Pt on the substrate has a hexagonal surface structure, and accordingly, a multiferroic layer having hexagonal crystalline structure can be formed on the conductive layer.

The structure according to the present invention can be applied to various devices requiring multiferroic properties. For example, since said structure has both non-volatile FRAM and MRAM properties at the same time, it can be used for multi-functional memory device with enhanced memory density. Also, since the structure of the present invention has ferromagnetic properties, it can be used as GMR (Giant Magnetoresistance) spin valve and can be used in spintronics, temperature sensor, pressure sensor, magnetic sensor, motion sensor, 3-dimensional computer game. Moreover, the structure can be used for micro operational device, microactuator, charge storage, etc.

Hereinafter, with reference to the examples, the present invention will be described in more detail.

EXAMPLES

Example 1

Formation of TbMnO$_3$ Layer

The TbMnO$_3$ layer was formed on a sapphire substrate [Al$_2$O$_3$ (001)] which has a hexagonal surface structure, using pulsed laser deposition method. In particular, the TbMnO$_3$ powder was annealed at 1350° C. for 24 hours, pressurized by hydrostatic pressure of 140 psi and finally sintered to form a TbMnO$_3$ target. Then, the plasma was formed by illuminating the laser pulse from the KrF excimer laser on said target, and using said plasma, a TbMnO$_3$ layer was formed on the sapphire substrate. During the process, the 4 pulse/sec repetition rate of laser with 0.4 W/s fluences were used. Also, while the layer was being formed, the substrate temperature was 850° C.~900° C., oxygen pressure was 30~100 mTorr, and base vacuum pressure was 10$^{-6}$ Torr. A 50 nm thick TbMnO$_3$ layer was obtained by depositing the TbMnO$_3$ material for 20 minutes under such condition.

Figure 7:
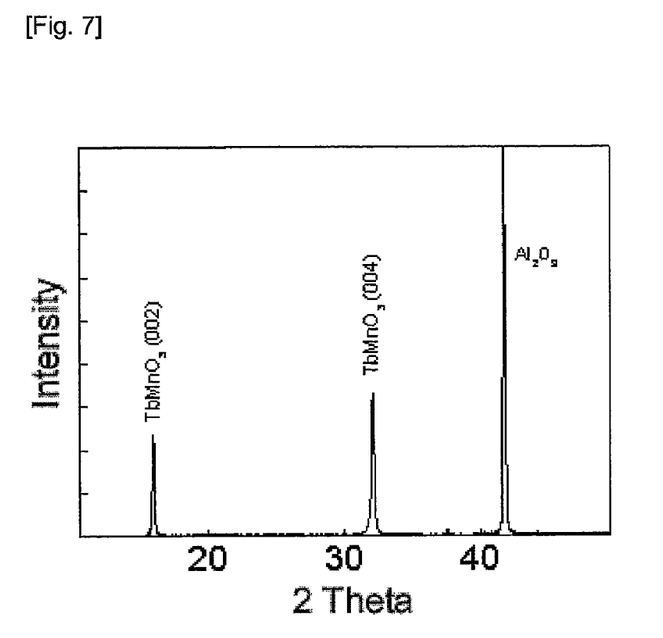
FIG. 7 is a graph illustrating the XRD θ-2θ scan of the hexagonal TbMnO$_3$ layer deposited on sapphire substrate.

The XRD (X-ray diffraction) result of TbMnO$_3$ layer formed in example 1 is shown in FIG. 7. FIG. 7 is an XRD θ-2θ scan graph ranging from 10~50° with regard to the TbMnO$_3$ layer deposited on sapphire substrate. As shown in FIG. 7, the peak shown at 15.5° and 31° are hexagonal TbMnO$_3$ peaks of 002, 004. From this, it can be confirmed that the TbMnO$_3$ layer deposited on sapphire substrate is grown to have hexagonal crystalline structure.

Example 2

Formation of Structure

Figure 8:
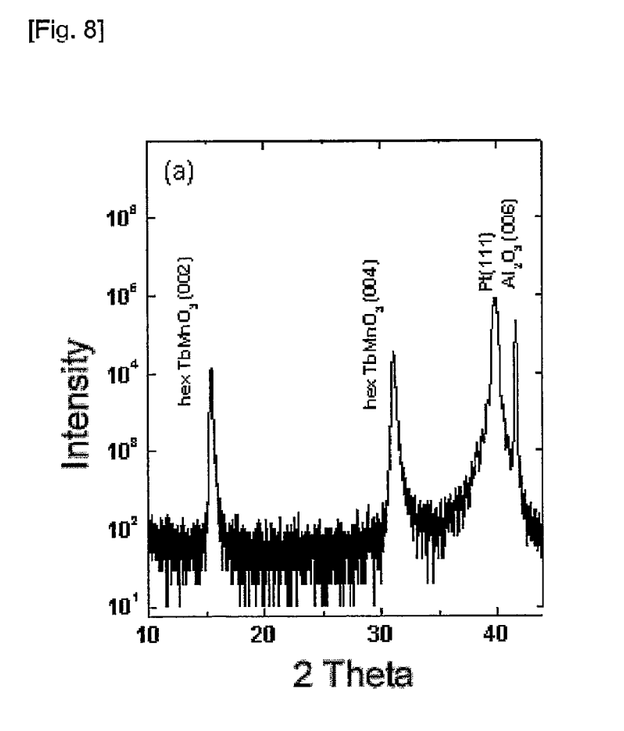
FIG. 8 is a graph illustrating the XRD θ-2θ scan of hexagonal TbMnO$_3$ layer deposited on Pt coated sapphire substrate.
Figure 9:
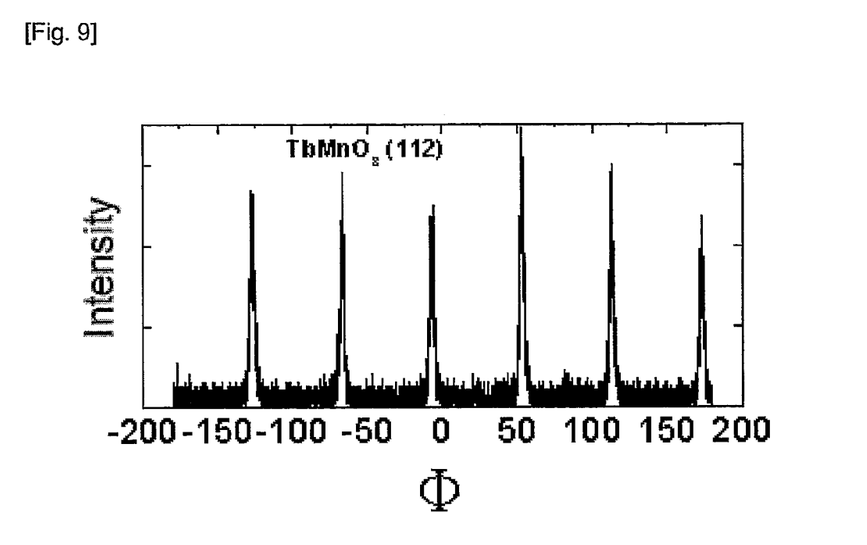
FIG. 9 is a graph illustrating the XRD Φ scan of hexagonal TbMnO$_3$ layer deposited on Pt coated sapphire substrate.
Figure 10:
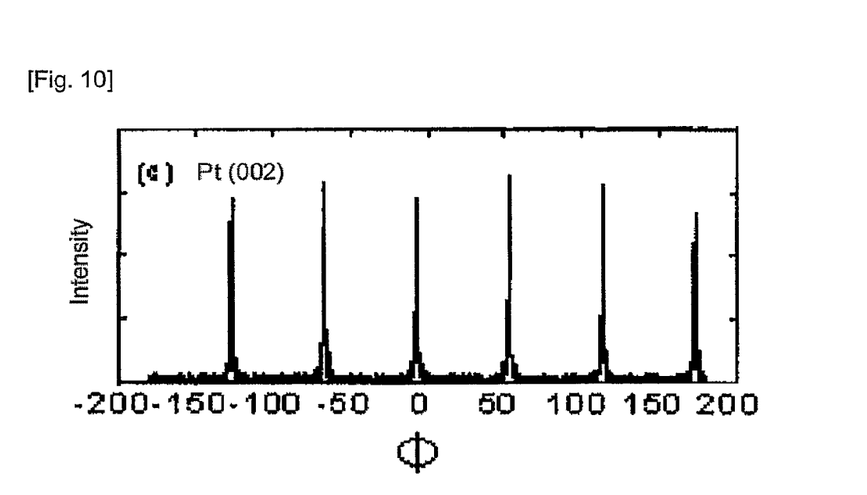
FIG. 10 is a graph illustrating the XRD Φ scan of Pt layer coated on sapphire substrate.
Figure 11:
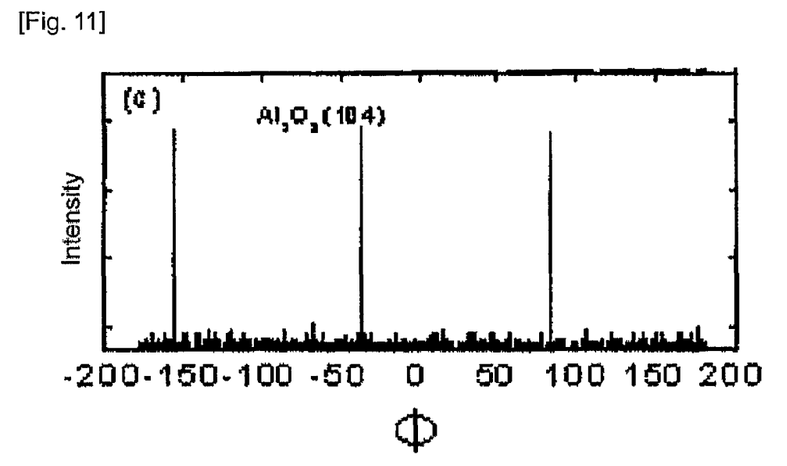
FIG. 11 is a graph illustrating the XRD Φ scan of sapphire substrate.

By using Dc-magnetron sputter, the 20 nm thick Pt layer was formed on sapphire (001) substrate. Then, on the Pt layer, the TbMnO$_3$ layer was formed as shown in example 1. The XRD results analyzing the multiferroic structure formed as above are shown in the following FIGS. 8~11. FIGS. 8~11 are scan graphs illustrating the XRD results analyzing the structure formed by example 2. In particular, FIG. 8 is a XRD θ-2θ scan graph of TbMnO$_3$ layer formed on a Pt coated sapphire substrate, FIG. 9 is an XRD Φ scan graph of TbMnO$_3$ layer, FIG. 10 is an XRD Φ scan graph of Pt layer, and FIG. 11 is an XRD Φ scan graph of the sapphire substrate.

In FIG. 8, the hexagonal TbMnO$_3$ peaks of 002, 004 are shown at 15.5° and 31°. Thus, it can be known that the TbMnO$_3$ layer has hexagonal crystalline structure. Also, as shown in FIG. 8, the peak at 39° indicates the 111 oriented grown Pt layer and the peak at 42° indicates the sapphire substrate. FIGS. 9~11 show the XRD scan results obtained by varying the Φ angle of 112 oriented TbMnO$_3$, Pt (002) and sapphire (104), respectively. From said XRD Φ scan graphs, the in-plane structure of the materials can be directly confirmed. Referring to FIG. 11, since the sapphire substrate has rhombohedral structure, it only has three peaks. However, since the surface structure of the substrate has a hexagonal surface structure, it is appropriate for forming the layer of hexagonal structure. Also, in FIG. 9, it can be confirmed that the TbMnO$_3$ layer has hexagonal crystalline structure by the φ scan of the 6-fold symmetry. Meanwhile, comparing FIGS. 10 & 11, it can be known that the positions of the peaks have shifted by 30°. Thus, it can be known that the Pt layer is deposited on the sapphire substrate by an in-plane 30° rotation. As a result, from FIGS. 8~11, it can be known that Pt has epitaxially grown on the sapphire substrate (001) and the TbMnO$_3$ (001) layer has epitaxially grown on the Pt (111) layer.

Example 3

Formation of Capacitor

A capacitor is formed by forming an Au layer on top of the multiferroic structure formed in example 2. In particular, a capacitor comprising a Pt layer as bottom electrode, TbMnO$_3$ layer which has hexagonal crystalline structure as a dielectric layer, and an Au layer as top electrode, is formed.

Figure 12:
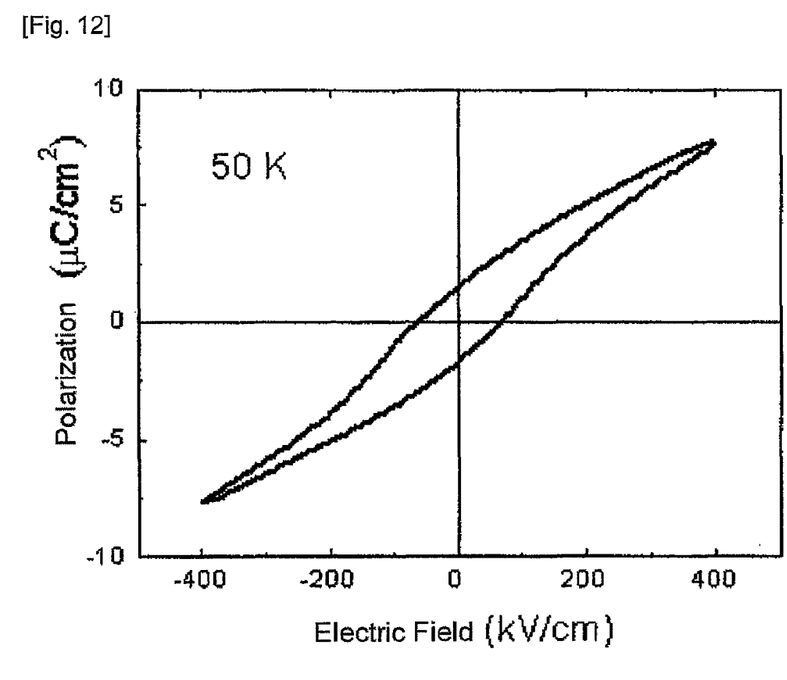
FIGS. 12 to 14 are graphs illustrating the ferroelectric polarization of TbMnO$_3$ using a T-F analyzer.
Figure 13:
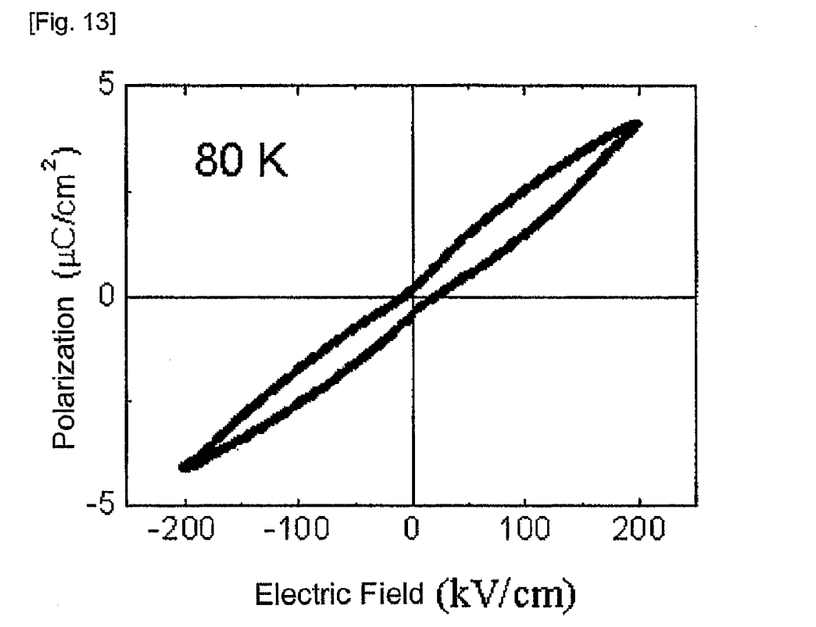
Figure 14:
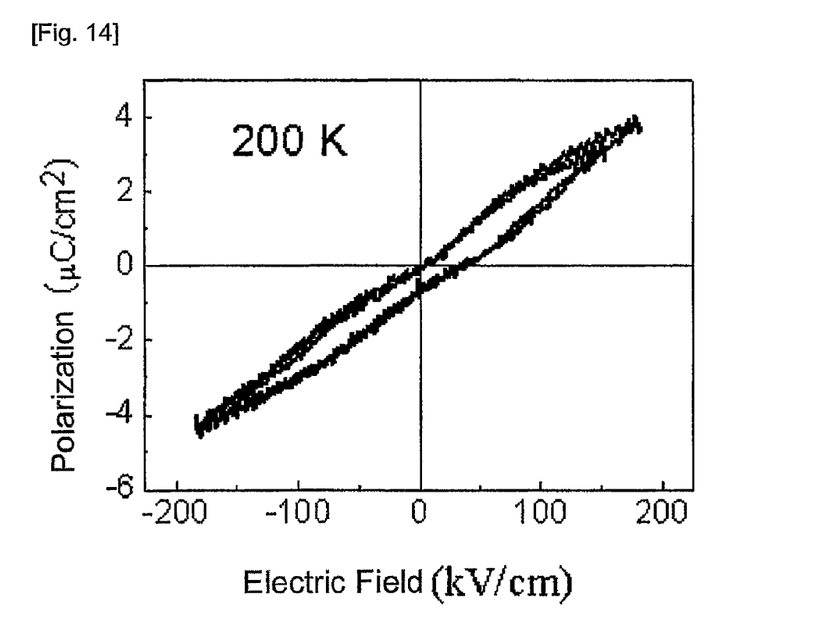

The multiferroic properties against the TbMnO$_3$ layer in the capacitor formed as above were measured. In particular, by using a T-F analyzer, the ferroelectric polarization value of the TbMnO$_3$ layer was measured at various frequencies and temperature. The results are shown in FIGS. 12~14. More particularly, FIG. 12 is a graph illustrating the function between the polarization value of the TbMnO$_3$ layer included in the capacitor and electric field at a frequency of 2 kHz and a temperature of 50 K, FIG. 13 is a graph illustrating the function between the polarization value of the TbMnO$_3$ layer included in the capacitor and electric field at a temperature of 80 K, and FIG. 14 is graph illustrating the function between the polarization value of the TbMnO$_3$ layer included in the capacitor and electric field at a frequency of 100 kHz and a temperature of 200 K.

Figure 15:
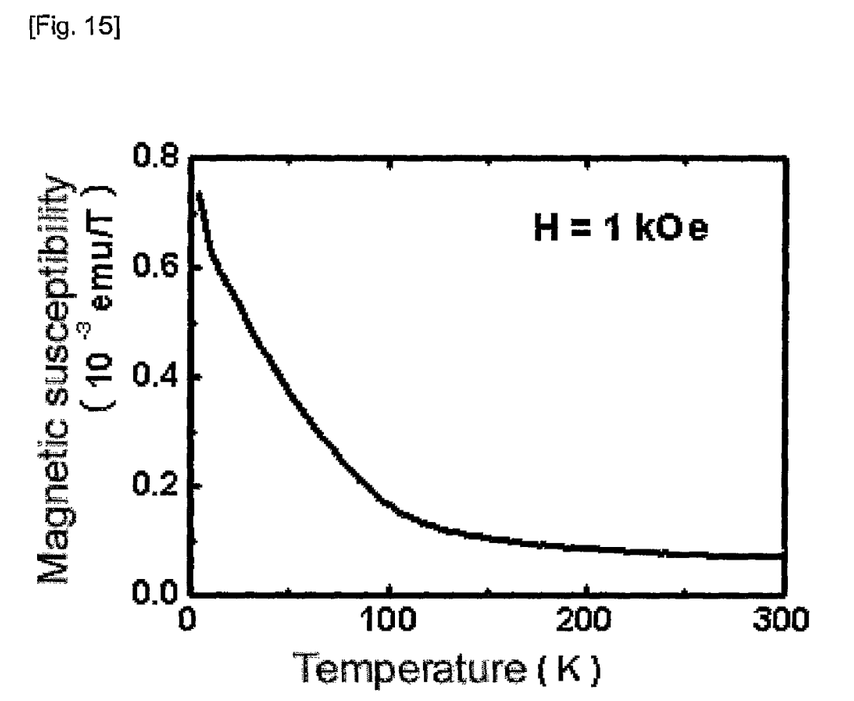
FIG. 15 is a graph illustrating the magnetic susceptibility of TbMnO$_3$ layer.

Referring to FIG. 12, the TbMnO$_3$ layer included in the capacitor shows clear ferroelectric properties at a low temperature such as 50 K, and shows a ferroelectric remnant polarization value of 1.50 μC/cm$^2$ which is at least 10 times higher than the ordinary orthorhombic TbMnO$_3$ layer. Also, FIG. 13 shows a double loop shape of hysteresis. Thus, it can be known that the TbMnO$_3$ layer shows antiferroelectric phase at a temperature of at least 80 K. Such an antiferroelectric phase is not usually observed in conventional multiferroic materials. Meanwhile, referring to FIG. 14, when the polarization value is measured at a temperature of 200 K and frequency of 100 kHz, it can be known that the TbMnO$_3$ layer still maintains the antiferroelectric phase. Therefore, from FIGS. 12~14, it can be known that the TbMnO$_3$ layer having a hexagonal crystalline structure of the present invention shows antiferroelectric phase under various temperature range. Also, from FIG. 15, it can be known that the TbMnO$_3$ layer is a multiferroic material also having magnetic properties.

Example 4

Formation of Capacitor Comprising a DyMnO$_3$ Layer

By using the same method as in example 3, the capacity structure was made by forming a 50 nm thick DyMnO$_3$ layer on Pt conductive layer which is deposited on sapphire substrate and forming an Au layer as a top electrode.

The ferroelectric transition temperature and remnant polarization value of the TbMnO$_3$ and DyMnO$_3$ layer formed in examples 3 & 4 are measured. Results are shown in the following table 1. Meanwhile, in order to be compared with the multiferroic layer of the present invention, the ferroelectric phase temperature and remnant polarization of TbMnO$_3$, DyMnO$_3$, and GdMnO$_3$, compounds having orthorhombic crystalline structures in bulk phase, are shown in the following table 2.

TABLE 1

| Multiferroic layer | Ferroelectric transition temperature (T$_C$) | Remnant polarization value (P$_R$) |
|---|---|---|
| TbMnO$_3$ | >60 K | >2.10 μC/cm$^2$ |
| DyMnO$_3$ | >160 K | >3.50 μC/cm$^2$ |

TABLE 2

| material | Ferroelectric transition temperature (T$_C$) | Remnant polarization value (P$_R$) |
|---|---|---|
| GdMnO$_3$ | 12 K | 0.06 μC/cm$^2$ |
| TbMnO$_3$ | 27 K | 0.08 μC/cm$^2$ |
| DyMnO$_3$ | 21 K | 0.21 μC/cm$^2$ |

Comparing the physical properties shown in Tables 1 & 2, it can be confirmed that the multiferroic layer having a crystalline structure different from that in bulk phase as in the present invention shows phase transition temperature and ferroelectric remnant polarization value relatively higher than those of the layer having crystalline structure in bulk phase.

The multiferroic layer according to the present invention has ferroelectric and antiferromagnetic properties at relatively high temperatures. Accordingly, in said multiferroic layer, the remnant polarization value, the magnetoelectric coupling, etc. increase. Thus, the multiferroic layer of the present invention can be practically applied to all fields requiring multiferroic properties. For example, it can be used in a temperature sensor or charge storage, etc.

The detailed description of the invention described in the above is explained referring to preferable examples of the present invention. However, a person having ordinary skill in the art can understand that the present invention may be modified and changed within a range that does not deviate from the technical idea and field of the present invention.

What is claimed is:

1. A multiferroic layer comprising a material represented by a formula (1),

R representing Tb, and the material having an epitaxially stabilized hexagonal crystalline structure substantially different from an orthorhombic crystalline structure in a bulk phase, and a substantially higher ferroelectric transition temperature and remnant polarization than that of the material in the bulk phase.

2. The multiferroic layer of claim 1, wherein the material has an antiferroelectric property.

3. A method of forming a layer as defined in claim 1 by using a substrate having a hexagonal surface structure substantially different from an orthorhombic surface structure of a material in a bulk phase.

4. The method of claim 3, wherein the substrate comprises sapphire substrate or yttria-stabilized zirconium substrate.

5. A structure comprising:
  a conductive layer; and
  a multiferroic layer according to claim 1 formed on the conductive layer.

6. The structure of claim 5, wherein the conductive layer comprises at least one conductive material selected from the group consisting of ruthenium (Ru), osmium (Os), iridium (Ir), platinum (Pt), titanium (Ti), titanium nitride (TiN), aurum (Au), iridium oxide ($IrO_2$) and strontium ruthenium oxide ($SrRuO_3$).

7. The structure of claim 6, wherein the conductive material comprises platinum.

* * * * *